US007413672B1

(12) United States Patent
Keil

(10) Patent No.: US 7,413,672 B1
(45) Date of Patent: Aug. 19, 2008

(54) CONTROLLING PLASMA PROCESSING USING PARAMETERS DERIVED THROUGH THE USE OF A PLANAR ION FLUX PROBING ARRANGEMENT

(75) Inventor: Douglas L. Keil, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 291 days.

(21) Appl. No.: 11/398,306

(22) Filed: Apr. 4, 2006

(51) Int. Cl.
*G01L 21/30* (2006.01)
*G01R 31/00* (2006.01)

(52) U.S. Cl. .................................................. 216/59
(58) Field of Classification Search .................... 216/59, 216/67, 68; 438/710, 714; 156/345.48, 345.24; 324/678; 118/712
See application file for complete search history.

(56) References Cited

U.S. PATENT DOCUMENTS 5,936,413 A 8/1999 Booth et al.

FOREIGN PATENT DOCUMENTS

| EP | 0792571 B1 | 9/1997 |
|---|---|---|
| FR | 2738984 A1 | 3/1997 |
| WO | WO 9711587 A1 | 3/1997 |

OTHER PUBLICATIONS

Braithwaite, N ST J et al., "Transient RF self-bias in electropositive and electronegative plasmas", Journal of Physics D: Applied Physics, Oct. 30, 2003, pp. 2837-2844, Institute of Physics Publishing, UK.
Booth, Jean-Paul, "Diagnostics of etching plasmas", Pure and Applied Chemistry, pp. 397-400, vol. 74, No. 3, 2002.
Braithwaite, N ST J et al., "A novel electrostatic probe method for ion flux measurements", Plasma Sources Sci. Technol. 5, 1996, pp. 677-684, Institute of Physics Publishing, UK.
Booth, J.P. et al., "Measurements of characteristic transients of planar electrostatic probes in cold plasmas", Review of Scientific instruments, Jul. 2000, pp. 2722-2727, vol. 71 No. 7.
DC Sheaths: Electrostatic Probe Diagnostics, pp. 170-189.

*Primary Examiner*—Roberts Culbert
(74) *Attorney, Agent, or Firm*—IP Strategy Group, P.C.

(57) ABSTRACT

Methods and apparatus for detecting and/or deriving the absolute values of and/or the relative changes in parameters such as the plasma potential and the ion flux using a Planar Ion Flux (PIF) probing arrangement are disclosed. The detected and/or derived values are then employed to control plasma processing processes.

44 Claims, 6 Drawing Sheets

CONTROLLING PLASMA PROCESSING USING PARAMETERS DERIVED THROUGH THE USE OF A PLANAR ION FLUX PROBING ARRANGEMENT

BACKGROUND OF THE INVENTION

The present invention relates in general to substrate manufacturing technologies and in particular to methods and apparatus for measuring relative mean plasma potential in a plasma chamber.

In the processing of a substrate, e.g., a semiconductor wafer, a MEMS device, or a glass panel such as one used in flat panel display manufacturing, plasma is often employed. As part of the processing, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an example plasma process, a substrate is coated with a thin film of hardened emulsion (i.e., such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. Appropriate etchant source gases (e.g., $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $BCl_3$, $Cl_2$, etc.) are then flowed into the chamber. RF energy is then applied to the chamber to form a plasma.

To avoid confusion with concepts to be presented below, all RF energy applied for the purpose of forming plasma will be referred to as "chamber RF". The plasma created by application of chamber RF results in the formation of ionized species and also neutral molecular fragments (radical species) derived from the source gasses which are then directed toward the substrate to initiate surface chemical reactions that etch the exposed areas of the substrate. This RF energy can be applied either by capacitive or inductive means. This RF energy may be applied at one frequency or at a multiplicity of frequencies (e.g. 2 MHz, 27 MHz and 60 MHz). This RF energy gives rise to a potential within the plasma with respect to the chamber ground, commonly referred to as the "plasma potential". In actual application, the plasma potential is time dependent in accord with the applied chamber RF power used to sustain the plasma. However we will substantially simplify our discussion, without loss of relevance, by focusing instead upon a time averaged (mean) of the plasma potential. This mean plasma potential will be denoted as $V_p$.

In the instance of capacitive coupling of the chamber RF to the plasma, a coupling capacitor is used. Typically this capacitor, commonly referred to as a blocking capacitor, is connected between the substrate holder and the chamber RF source. It is well known to practitioners of art that when applying chamber RF energy via this blocking capacitor, a DC voltage will develop across this blocking capacitor. Herein this voltage will be referred to as the "chamber bias voltage" ($V_{chamber\ bias}$). Since the capacitor is connected to the substrate holder, this chamber bias voltage also represents the voltage of the substrate holder with respect to chamber ground. The chamber bias voltage should be carefully distinguished from the "probe bias voltage" ($V_b$) to be defined and discussed below.

In the instance of inductive coupling of the RF energy to the chamber, the substrate holder can be considered to be at zero chamber bias voltage ($V_{chamber\ bias}=0$). For all RF energy coupling schemes, the chamber walls (excepting the substrate holder) will also acquire a potential with respect to chamber ground which we define as $V_{wall}$. However, for most applications of practical importance, $V_{wall}$ tends to be approximately equal to the chamber ground.

Additionally, there occurs a plasma sheath layer which surrounds the entirety of the plasma and serves to separate the plasma from the chamber walls and substrate holder. This sheath layer surrounding the entirety of the plasma also contains an electric field. Charged particles transiting this sheath region will experience a force due to that field and will suffer either a net gain or loss of energy. The net energy acquired will depend on the electric potential difference and its time dependence between the substrate surface/wall and the plasma. This electric potential difference is referred to as the "sheath potential" ($V_{sheath}$).

From the foregoing discussion, one may also see that the in the instance of a plasma over the substrate holder, the sheath potential is given by the plasma potential minus the chamber bias voltage ($V_{chamber\ sheath}=V_p-V_{chamber\ bias}$). In the instance of a plasma over a wall surface the sheath potential is given by the plasma potential minus the wall voltage ($V_{chamber\ sheath}=V_p-V_{wall}$). Note that since the plasma potential is time dependent we may then also expect that the sheath potential will be time dependent.

The above discussion only focuses on a few parameters (e.g., sheath potential) associated with a typical plasma process. In general, the quality of the results of processes referenced above frequently depend sensitively on a number of parameters, including for example the charged species impact energy, which tends to correspond to the sheath potential since the charged species gain energy primarily while transiting the sheath above the substrate. However, a direct measurement of the sheath potential is often impractical.

Another example parameter that may also impact the process result is the rate at which ionized gas species are delivered to the substrate (i.e., ion particle flux). However, a direct measurement of the ion particle flux tends to be difficult to implement. Oftentimes, in the absence of absolute measurable values of these and other parameters, changes in these and other parameters may be yield valuable information that may also be employed to control the plasma process. Accordingly, even if absolute measurements are not possible, a detection of relative changes in the values of these and other parameters is still desirable.

In view of the foregoing, the invention presented herein discloses various theoretical bases and proposes various techniques for indirectly ascertaining the absolute values of and/ or for detecting relative changes in certain parameters associated with the plasma process. The invention further discloses the use of the measurements and/or detection results in controlling various aspects of the plasma process.

SUMMARY OF THE INVENTION

The invention relates, in an embodiment, to a method for controlling a substrate processing process, the substrate processing process being configured to process a substrate using plasma in a substrate processing chamber. The method includes providing a PIF (planar ion flux) measurement arrangement, the PIF measurement arrangement including at least a PIF probe that has a surface exposed to a plasma sheath of the plasma while the substrate is processed by the plasma. The method also includes alternately creating a charging phase and a quiescent phase for the PIF arrangement using an energy source that is configured to provide energy to the plasma via the PIF probe. The method additionally includes ascertaining a time $t_{point2}$, the time $t_{point2}$ representing a time during the charging phase of the PIF measurement arrangement wherein a first potential difference across the plasma sheath equals the plasma potential of the plasma. The method further includes ascertaining a time $t_{point3a}$, the time $t_{point3a}$ representing a time during the charging phase of the PIF measurement arrangement wherein a second potential difference across the plasma sheath equals a floating potential, the floating potential representing a value of a potential difference across the plasma sheath during the charging phase when no current flows through the PIF probe. The floating potential at time $t_{point3}$ is achieved while RF is applied to the PIF probe. Furthermore, the method includes generating a control signal to create at least one of an alarm and a transition in the substrate processing process if a time difference between the time $t_{point2}$ and the time $t_{point3a}$ meets a predefined condition.

In another embodiment, the invention relates to a method for controlling a substrate processing process, the substrate processing process being configured to process a substrate using plasma in a substrate processing chamber. The method includes providing a PIF (planar ion flux) measurement arrangement, the PIF measurement arrangement including at least a PIF probe that has a surface exposed to a plasma sheath of the plasma while the substrate is processed by the plasma. The method also includes alternately creating a charging phase and a quiescent phase for the PIF arrangement using an energy source that is configured to provide energy to the plasma via the PIF probe. The method additionally includes ascertaining a time $t_{point2}$, the time $t_{point2}$ representing a time during the charging phase of the PIF measurement arrangement wherein a first potential difference across the plasma sheath equals to the plasma potential of the plasma. The method further includes ascertaining a probe bias voltage at the time $t_{point2}$, the probe bias voltage at the time $t_{point2}$ representing a potential difference between the surface of the PIF probe and ground at the at the time $t_{point2}$. The method also includes generating a control signal to create at least one of an alarm and a transition in the substrate processing process if the probe bias voltage at the time $t_{point2}$ meets a predefined condition.

In yet another embodiment, the invention relates to a method for controlling a substrate processing process, the substrate processing process being configured to process a substrate using plasma in a substrate processing chamber. The method includes providing a PIF (planar ion flux) measurement arrangement, the PIF measurement arrangement including at least a PIF probe that has a surface exposed to a plasma sheath of the plasma while the substrate is processed by the plasma. The method additionally includes alternately creating a charging phase and a quiescent phase for the PIF arrangement using an energy source that is configured to provide energy to the plasma via the PIF probe. The method further includes ascertaining a time $t_{point2}$, the time $t_{point2}$ representing a time during the charging phase of the PIF measurement arrangement wherein a first potential difference across the plasma sheath equals to a plasma potential of the plasma. The method also includes ascertaining a probe bias voltage at the time $t_{point2}$, the probe bias voltage at the time $t_{point2}$ representing a second potential difference between the surface of the PIF probe and ground at the at the time $t_{point2}$. The method also includes ascertaining a time $t_{point3a}$, the time $t_{point3a}$ representing a time during the charging phase of the PIF measurement arrangement wherein a second potential difference across the plasma sheath equals a floating potential in the presence of an applied RF signal to the probe, the floating potential representing a value of a third potential difference across the plasma sheath during the charging phase when no current flows through the PIF probe. The method further includes ascertaining a probe bias voltage at the time $t_{point3b}$, the probe bias voltage at the time $t_{point3b}$ representing a fourth potential difference between the surface of the PIF probe and the ground at the at the time $t_{point3b}$. This fourth point represents conditions at the moment of removal of the applied RF to the probe surface. The method also includes ascertaining a difference between the probe bias voltage at the time $t_{point2}$ and the probe bias voltage at the time $t_{point3b}$. Still further, the method includes generating a control signal to create at least one of an alarm and a transition in the substrate processing process if the difference between the difference between the probe bias voltage at the time $t_{point2}$ and the probe bias voltage at the time $t_{point3b}$ meets a predefined condition.

In another embodiment, the invention relates to a method for controlling a substrate processing process, the substrate processing process being configured to process a substrate using plasma in a substrate processing chamber. The method includes providing a PIF (planar ion flux) measurement arrangement, the PIF measurement arrangement including at least a PIF probe that has a surface exposed to a plasma sheath of the plasma while the substrate is processed by the plasma. The method further includes alternately creating a charging phase and a quiescent phase for the PIF arrangement using an energy source that is configured to provide energy to the plasma via the PIF probe. The method additionally includes ascertaining a time $t_{point2}$, the time $t_{point2}$ representing a time during the charging phase of the PIF measurement arrangement wherein a first potential difference across the plasma sheath equals to a plasma potential of the plasma. The method also includes ascertaining a probe bias voltage at the time $t_{point2}$, the probe bias voltage at the time $t_{point2}$ representing a second potential difference between the surface of the PIF probe and ground at the at the time $t_{point2}$. Still further, the method includes ascertaining a time $t_{point3a}$, the time $t_{point3a}$ representing a time during the charging phase of the PIF measurement arrangement wherein a second potential difference across the plasma sheath equals a floating potential, the floating potential representing a value of a third potential difference across the plasma sheath during the charging phase when no current flows through the PIF probe. The method also includes ascertaining a probe bias voltage at the time $t_{point3b}$, the probe bias voltage at the time $t_{point3b}$ representing a fourth potential difference between the surface of the PIF probe and the ground at the at the time $t_{point3b}$. The method further includes ascertaining a difference between the probe bias voltage at the time $t_{point2}$ and the probe bias voltage at the time $t_{point3b}$. The method includes ascertaining an electron temperature of the plasma using the difference between the probe bias voltage at the time $t_{point2}$ and the probe bias voltage at the time tpoint3 and a effective ion mass value. The method further includes generating a control signal to create at least one of an alarm and a transition in the substrate processing process if the electron temperature meets a predefined condition.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
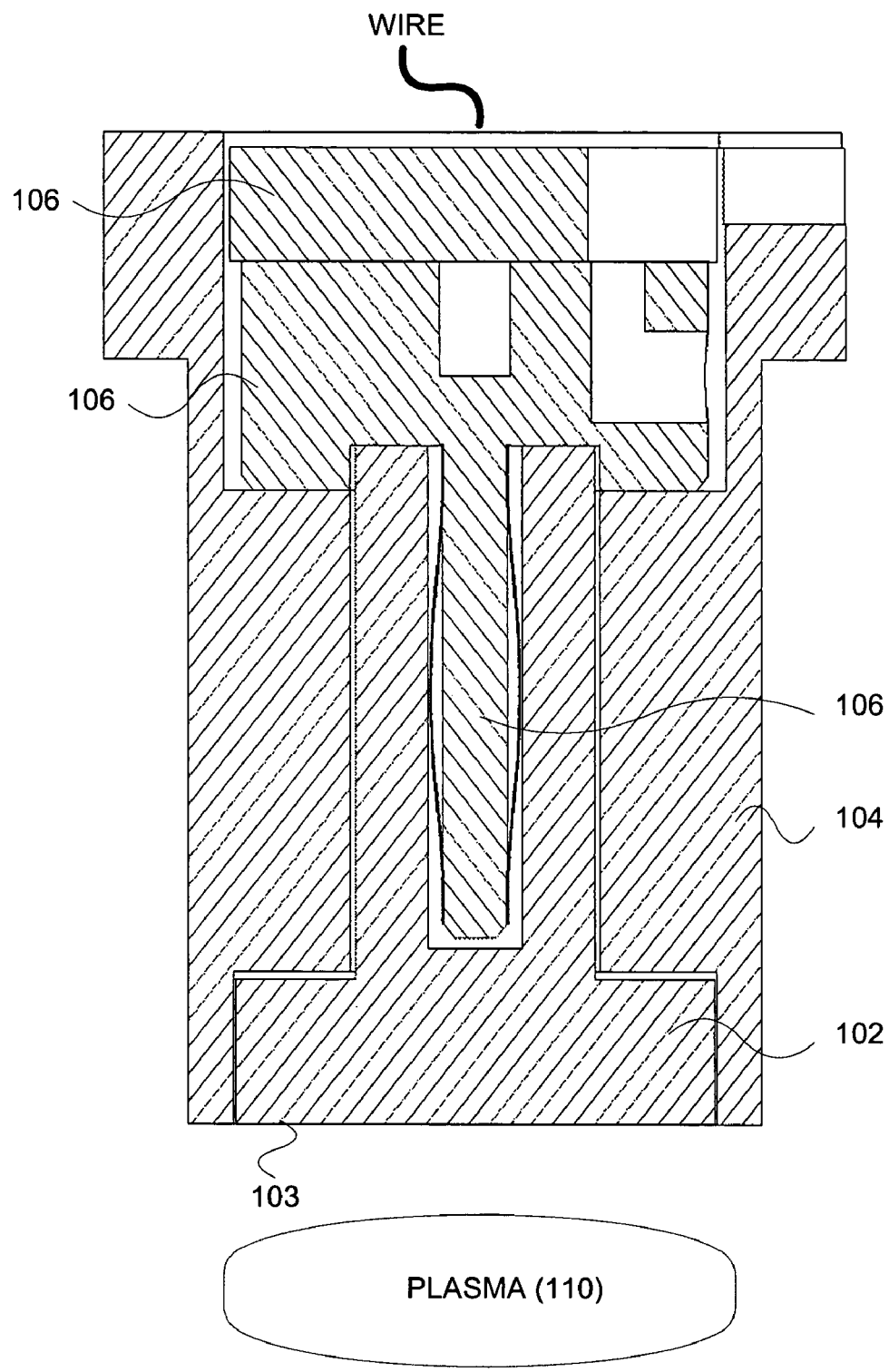
FIG. 1 illustrates simplified diagram of a PIF probe.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps, physical effects and/or structures have not been described in detail in order to not unnecessarily obscure the present invention.

It is recognized by the inventor herein that the process result depends upon the rate at which ionized gas species are delivered to the substrate (i.e., ion particle flux). As discussed earlier, results of said processes are also commonly known to depend sensitively upon the energy delivered to the substrate surface by ionized gas species impact. The particular case of an ion limited etch process (a very common occurrence in etch processing) provides one such example in that changes in ion energy in this case are well known to closely correlate with etch rate and the geometry of the etched profile cross section. The well known sensitivity of an etch process to charged species impact energy motivates a desire to detect and monitor signals which can serve as indicators of charged species impact energy.

Additional benefit is gained if a measurement of ionized gas species arrival rate can be implemented simultaneous with the monitoring of an indicator of charged species impact energy. Since substrate charged species impact energy is primarily acquired by during transit of the sheath above the substrate, there tends to be a direct correspondence between charged species impact energy and the substrate sheath potential.

Unfortunately, direct measurement of sheath potential is usually not practical. However, as previously noted, the substrate sheath potential can be derived from the difference between the plasma potential and the chamber bias potential (i.e., $V_{sheath}=V_p-V_{chamber\ bias}$). The chamber bias potential is a readily measurable quantity. In instances where the chamber bias potential is known to be of fixed value, detection of changes in plasma potential can serve as a good indicator of changes in charged species impact energy. Measurement of plasma potential by use in the prior art has typically been very difficult and impractical for many industrially relevant applications. A new and more industrially useful method for a relative measurement of plasma potential would therefore be desirable.

In actual practice, the energy delivered by each ion impacting the substrate surface spans a range of values. The time average of the number of particles impacting the substrate with a given energy is defined to be the Ion Energy Distribution Function (IEDF). The distribution of these energies (the IEDF) is a consequence of the time variation of the sheath potential. In most circumstances of practical interest, it is not necessary to know the complete details of the IEDF. Rather, it is often sufficient to know the mean ion energy that one could have derived from knowledge of the IEDF. As may be expected from the discussion above, changes in mean ion energy can be inferred from changes in the mean value of the difference between the plasma potential and the chamber bias potential (i.e., $V_{sheath}=V_p-V_{chamber\ bias}$). In instances where the chamber bias is invariant, one can also infer such changes from changes in the plasma potential only.

In many applications of industrial importance, it is only the detection of deviations from nominal conditions that is of interest. Thus in the case of an ion energy measurement, it is often sufficient to have a means by which shifts in mean energy can be detected. This can be implemented by any relative indicator of mean ion energy in lieu of an absolute mean ion energy measurement. For example, if relative changes in sheath potential could be detected, this can be used as a means to infer changes ion energy. If the chamber bias voltage is either measured or known to be invariant, the monitoring of an indicator of plasma potential change could also meet this objective.

Applications of industrial importance also occur in which the linkage between the detected changes in plasma potential and charged species impact energy does not have to be established. Such applications are called "chamber fingerprinting" and are implemented by recording relative changes in a variety of chamber parameters to establish the "fingerprint" of the chamber for a given process. When subsequent processes are run, a fingerprint outside of that which has been established as nominal often suggests a fault condition. In this circumstance, detection of changes in plasma potential can serve as input for chamber fingerprinting with no further effort needed to link such changes to physical behavior occurring within the chamber.

Since many etch process are also well known to be sensitive to changes in ion flux as well as ion energy, it is advantageous to have a method which may simultaneously monitor the ion flux and monitor an indicator of change in the mean energy delivered to the substrate. As noted above, detection of changes in plasma potential is a desirable indicator of changes in the mean energy delivered to the substrate. Furthermore, it is also advantageous for the method to sample said quantities frequently over the course of the etch process. In particular sampling of ion flux and plasma potential (either relative or absolute) at intervals of less than 100 ms is desirable. Additionally, it is also advantageous to have a means (i.e., an arrangement or a technique) by which ion flux and ion energy could be monitored at a plurality of sites over the substrate. Accordingly, methods and apparatus for simultaneously detecting local changes in plasma potential and ion flux in a plasma processing chamber at sampling frequencies of industrial interest are desirable.

While not wishing to be bound by theory, it is believed by the inventor herein that the derivative with respect to time of the measured change in the current passing across the plasma sheath as of an electric probing system biased by an RF pulse may be analyzed by the methods disclosed herein to obtain a relative determination of changes in plasma potential. Further, if suitable measurements of the sheath floating voltage or the RF chamber bias voltage and applied chamber RF voltage are available, well known calibration techniques can be used to achieve an absolute measurement.

Using well known relationships between mean ion energy, plasma potential and chamber bias voltage it is also possible to infer changes in the mean ion energy. However in most applications of industrial importance, a relative indication of plasma potential is sufficient. That is, the measurement does not have to give a fixed, specific value, but can be calculated in comparison to a reference value. For example, if a plasma potential measurement is taken relative to a reference and then another plasma potential measurement is taken relative to the same reference at a later instant in time, the difference between both measurements represents the change in the plasma potential and does not depend on knowledge of the reference used. Changes in plasma potential can, in turn, be used to infer changes in the mean ion energy if the chamber bias voltage is known to be invariant or if its change has also been measured.

In an embodiment, ion flux and plasma potential shift are ascertained from an analysis of the measured collected current and the probe bias voltage from a planar ion flux (PIF) probing apparatus. A PIF apparatus is commonly implemented using a current collection surface (PIF probe) that does not extended beyond a plasma chamber wall into the plasma chamber itself. That is, the PIF probe may be substantially coplanar with the plasma chamber surface or, alternatively, may be recessed into a plasma chamber wall. The PIF probe is a member of a class of plasma probing methods collectively known as "Langmuir Probes". This "PIF probe" method is described in further detail in a prior patent included herein by reference (U.S. Pat. No. 5,936,413). However, the highlights of PIF probe operation are not germane to the present invention.

Referring now to FIG. 1, a simplified diagram of a PIF probe is shown, according to an embodiment of the invention. In general, the probe is comprised of a current collection structure, a conductive path, and an electrically insulating barrier which separates the collection disk and conduction path from the region in which it is embedded. The region in which the current collection structure is embedded is typically comprised by the chamber wall or the RF grounded counter electrode. However there is nothing fundamental to the method which would prevent embedding the current collection structure into the substrate surface.

The current collection structure 102 faces the plasma and is generally constructed of a conductive surface area 103 that is coplanar or recessed with respect to a plasma chamber surface. In an embodiment, current collection structure 102 is circular in area and comprised of doped silicon with a metalized surface to which a wire may be attached. Current collection structure 102 is further coupled to conductive path 106 which, in turn, is commonly connected to power/sensing electronics [not shown] that may measure the voltage and current characteristics of the ion flux probe with respect to chamber ground as slow transient currents and voltages which charge and discharge the capacitor $C_{PIF}$ (206).

Isolating current collection structure 102 and conductive path 106 from the plasma chamber [not shown] is an electrically insulating barrier 104. In an embodiment the electrically insulating barrier 104 comprises a dielectric, such as quartz. In an embodiment, electrical insulation barrier 104 is comprised of an electrically insulating ceramic such as aluminum nitride, aluminum oxide, etc. In an embodiment, electrical insulation barrier 104 is comprised by an air (vacuum) gap which is small enough to prevent plasma forming within the gap, but large enough to prevent arcing between conductive path 106 and plasma chamber [not shown].

Figure 2:
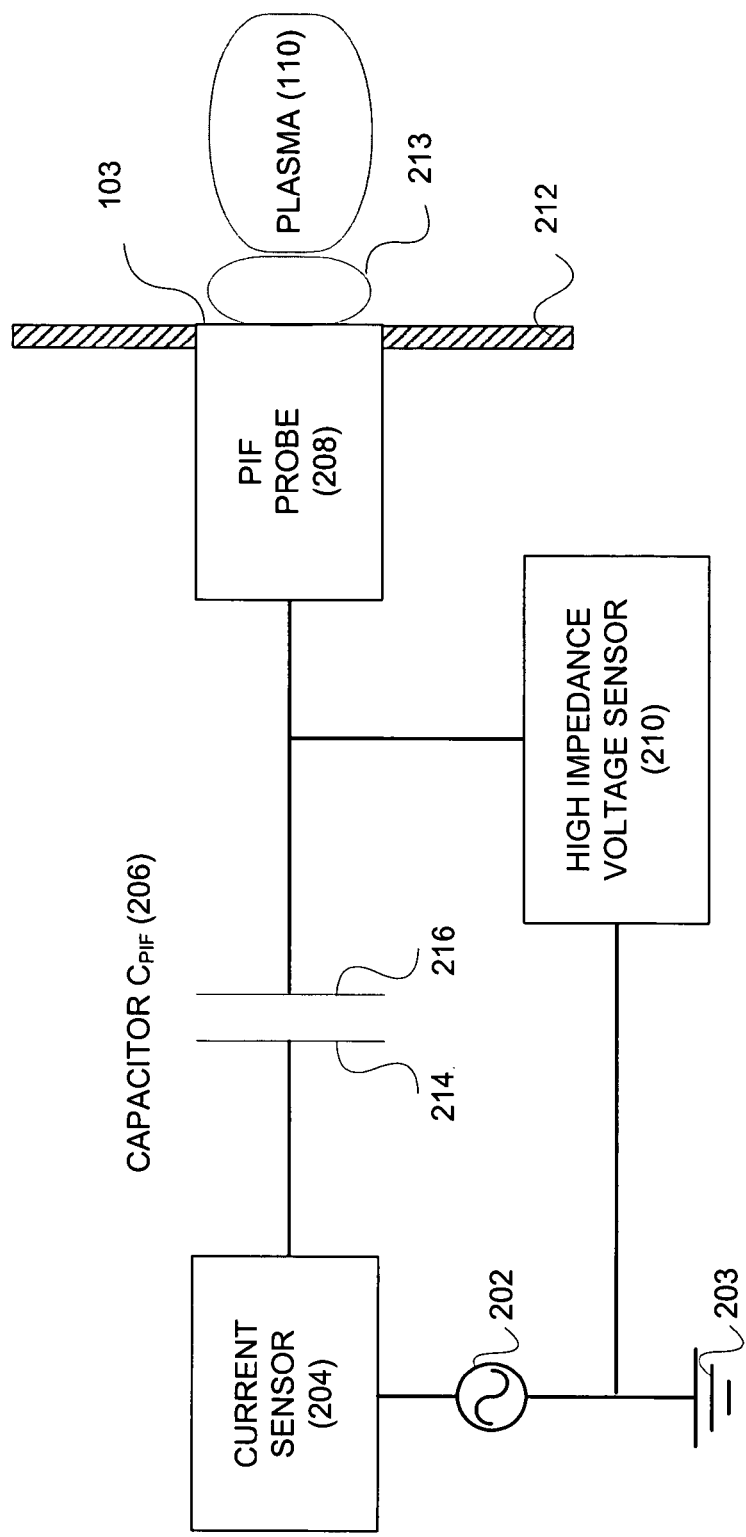
FIG. 2 illustrates a simplified diagram of a PIF probe measurement arrangement, according to an embodiment of the invention.

Referring now to FIG. 2, a simplified diagram of a PIF probe measurement apparatus is shown, according to an embodiment of the invention. In general, PIF probe 208 faces plasma sheath 213 and plasma 110, and is generally constructed of a conductive surface area that is coplanar with or recessed with respect to plasma chamber surface 212 as mentioned. In an embodiment, a pulsed probe RF source (an RF burst source) 202 is connected between chamber ground and the terminal of a DC blocking capacitor $C_{PIF}$ 206. This blocking capacitor should be distinguished from and not confused with the blocking capacitor previously mentioned through which the chamber RF is applied (not shown in FIG. 2). The DC blocking capacitor $C_{PIF}$ 206 is then in turn connected to the PIF probe 208, which faces plasma sheath 213 and plasma 110. In general, $C_{PIF}$ 206 is configured as two metallic plates separated and insulated from each other by a dielectric material.

A plasma sheath (probe sheath) 213 exists between the plasma 110 and the surface of the probe. In general, a plasma sheath will conduct a current in response to a voltage impressed across it. A voltage impressed across a plasma sheath is referred to as the sheath voltage ($V_{sheath}$). The specific instance of a voltage impressed across the plasma sheath 213 is referred to as the probe sheath voltage ($V_{probe\ sheath}$). In most instances of practical significance, the entirety of plasma 110 may be regarded as being equipotential. This equipotential, when measured with respect to chamber ground is then referred to as the plasma potential ($V_p$). If it were possible to vary the sheath voltage ($V_{sheath}$) across a given sheath, the conduction current which is then caused to flow through the sheath will vary in accordance with a well known voltage-current relationship (I-V curve). A representative example of such a voltage-current relationship (I-V curve) is diagramed in FIG. 3.

FIG. 2 shows that a means is also provided to measure the current collected by surface 103 in the form of current sensor 204. As a matter of analysis convenience, current sensor 204 is commonly designed to respond only to signals ranging from DC up through the audio range of frequencies. Signals in the RF range of frequencies (for example, above 500 KHz) are typically rejected. Note that application of Kirchoff's current law shows that current sensor 204 also measures the current through plasma sheath 213.

Figure 4:
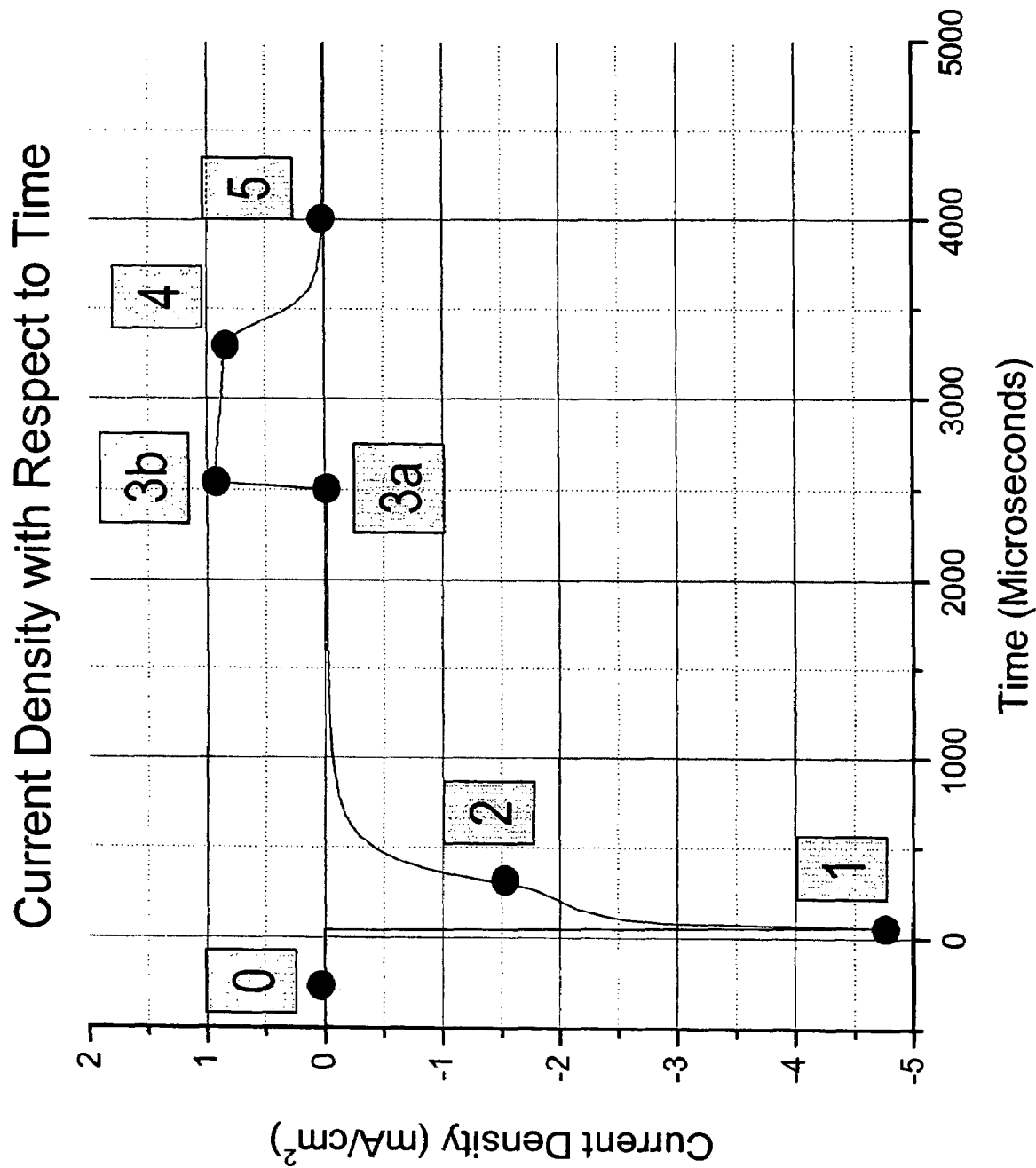
FIG. 4 provides a representative example of current data collected by the current sensor.

FIG. 4 provides a representative example of data collected by current sensor 204. This example data was collected using a Lam Research 2300 Exelan™ etch system configured for etching a 300 mm substrate. The plasma was sustained by 27 MHz chamber RF at a chamber temperature and substrate temperature of 20° C. Other operating parameters are detailed in Table 1 below:

TABLE 1

| | |
|---|---|
| Chamber Pressure: | about 60 to 70 mTorr |
| 27 MHz Power Range: | about 1700 to 2300 W |
| Argon Flow Rate: | about 200 to 300 sccm |
| $C_4F_8$ Flow Rate | about 15 sccm to about 20 sccm |
| $O_2$: | about 0 to 5 about sccm |

As a matter of analysis convenience, it is common practice to divide the collected current by the area of the collection surface 103 to obtain a determination of the current density (current per unit area) collected by current sensor 204. Following this common practice, FIG. 4 plots an example collected current density in units of $mA/cm^2$ as a function of time.

Figure 5:
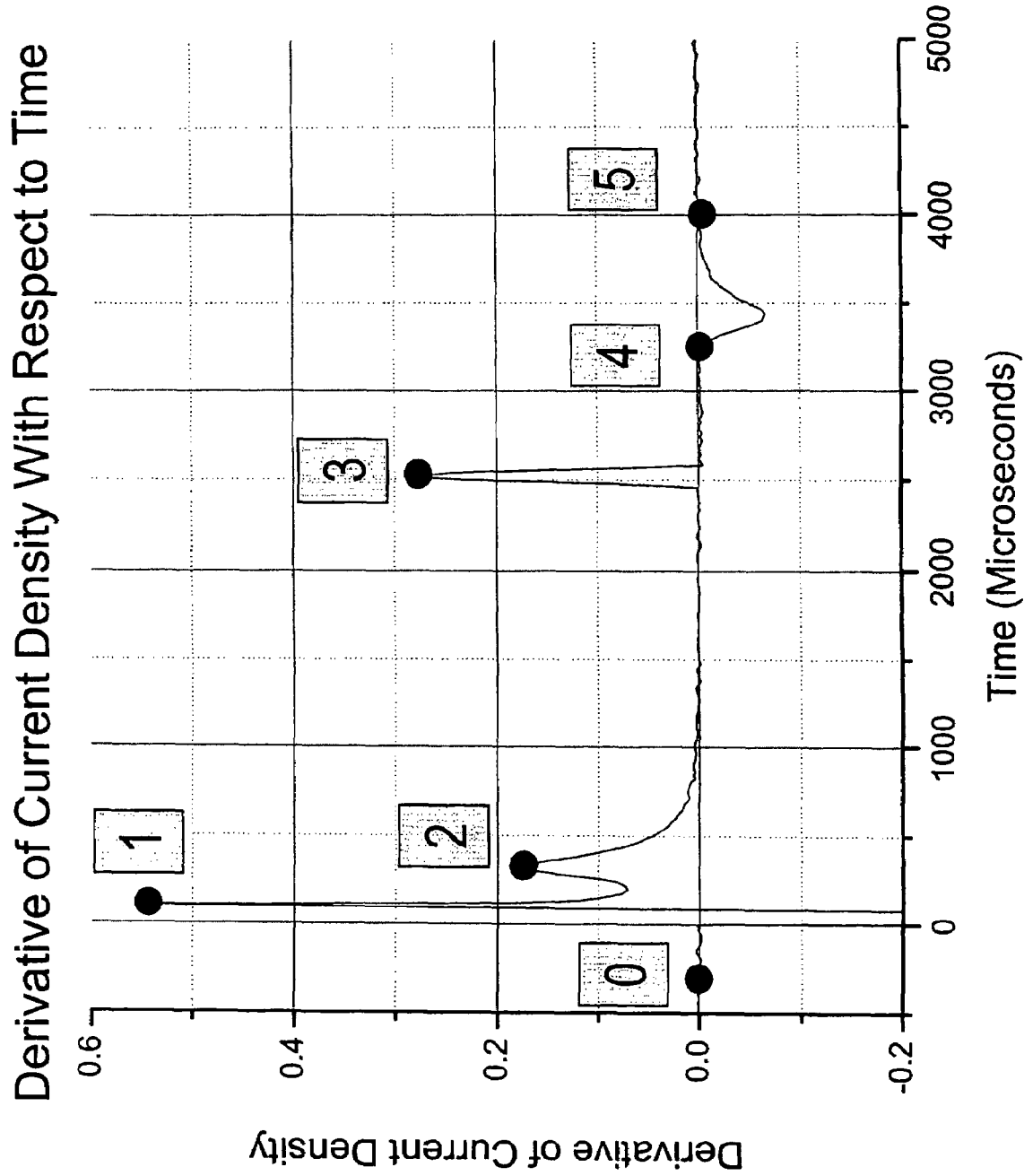
FIG. 5 plots the same data as presented in FIG. 4 but as a derivative respect to time, according to an embodiment of the invention.

FIG. 5 plots the same data as presented in FIG. 4 but as a derivative with respect to time. Since current sensor 204 is designed to respond only to an audio range of frequencies, FIGS. 4 and 5 do not show current variations caused by the full RF waveform during the RF burst interval (the interval between points 1 and 3 of FIGS. 4 and 5) for which the RF is applied. Effectively, what is shown in FIGS. 4 and 5 is the current obtained as a time average over an RF cycle at each point.

Returning to FIG. 2, it is seen that there is also provided a high impedance voltage sensor (210). As a matter of analysis convenience only, this high impedance voltage sensor (210) is commonly designed to respond only to signals ranging from DC up through the audio range of frequencies. Signals in the RF range of frequencies (for example, above 500 KHz) are typically rejected. High impedance voltage sensor (210) provides a measure of the voltage of the collection surface 103 with respect to chamber ground. This voltage is defined to be the probe bias voltage ($V_b$). The probe bias voltage ($V_b$) should be carefully distinguished from the probe sheath potential ($V_{probe\ sheath}$) indicated in FIG. 3, which is defined to be the voltage across the plasma sheath 213.

Figure 6:
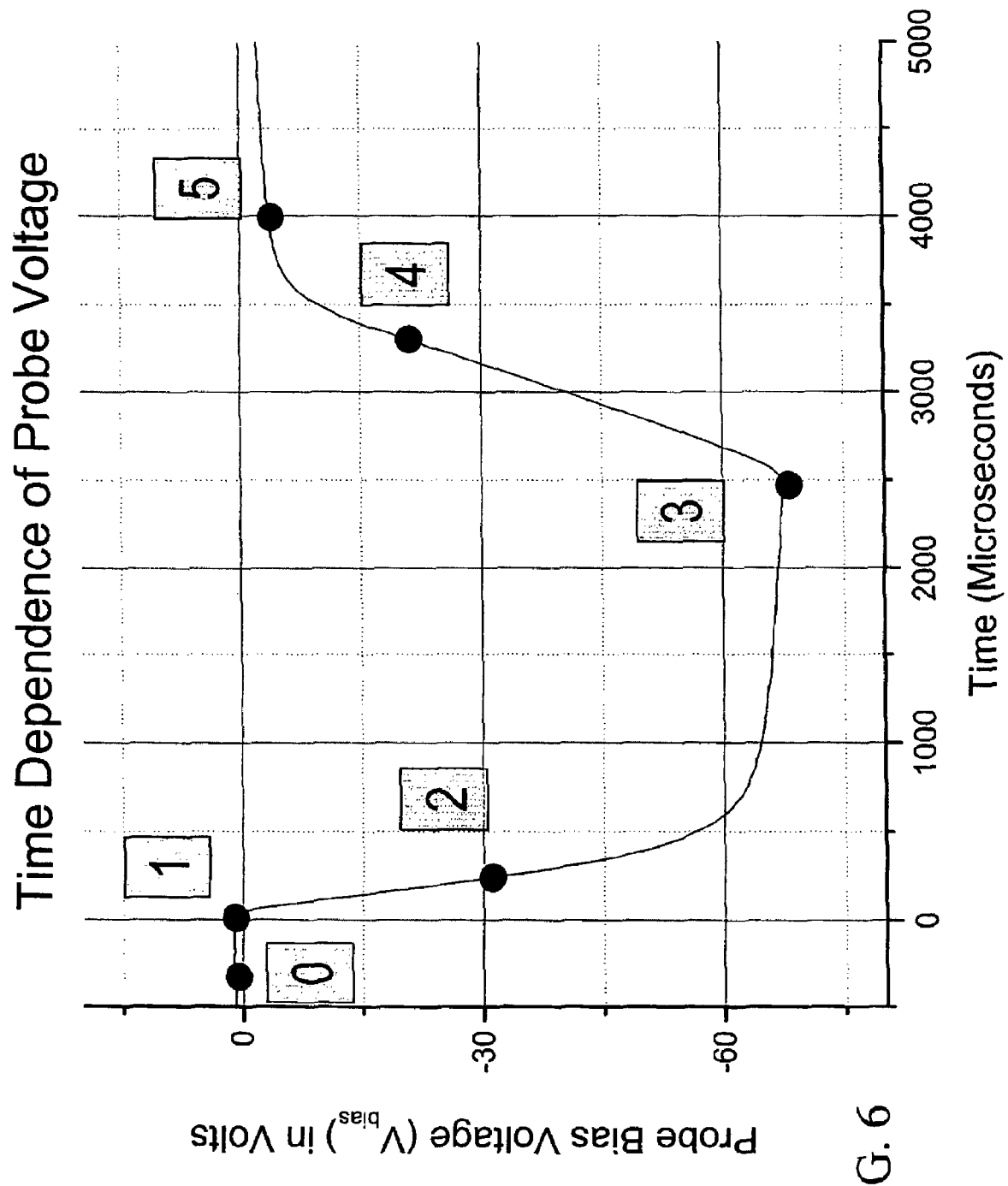
FIG. 6 plots an example probe bias voltage ($V_b$) as a function of time for the same conditions used to obtain the example data plotted in FIGS. 4 and 5.

FIG. 6 plots an example probe bias voltage ($V_b$) as a function of time for the same conditions used to obtain the example data plotted in FIGS. 4 and 5. Since voltage sensor 210 is designed to respond only to an audio range of frequencies, FIG. 6 does not show voltage variations due to the full RF waveform during the RF burst interval (the interval between points 1 and 3 of FIG. 6) for which the RF is applied. Effectively, what is shown is voltage obtained as a time average over an RF cycle at each point. From the discussion above, one may also note that the probe bias voltage is related to the probe sheath voltage ($V_{probe\ sheath}$) and the plasma potential ($V_p$) by use of the expression $V_b = V_{probe\ sheath} + V_p$.

The pulsed probe RF source 202 delivers an interval of typically single frequency RF of fixed amplitude (the RF burst interval) followed by an interval during which the probe RF source 202 is turned off (the quiescent interval). For the example embodiment used to obtain the data presented in FIGS. 4, 5, 6, the frequency was fixed at 11.5 MHz during the RF burst intervals for which the RF was turned on. In this instance, now given only by way of example, the RF burst interval was fixed at 2.5 milliseconds and the quiescent interval, during which the RF was off, was fixed at 30 milliseconds. The quiescent interval is commonly chosen to be long enough for the system to establish an equilibrium configuration of electric charge. This equilibrium distribution of charge will be such that there is no net flow of conduction current through the system.

The details of the charge distribution are determined by the details of the chamber design and the method by which the chamber RF voltage is applied. When the system has achieved this equilibrium condition and no conduction current flows and the voltage across the plasma sheath 213 (the sheath voltage) is said to be at the "floating potential" ($V_f$). This quantity is noted by way of illustration as point 3a,5 in FIG. 3.

In actual practice, direct measurement of the voltage across the plasma sheath at any point in the chamber (including the probe) is very difficult and rarely done. In the case of the example data set discussed above and used to obtain FIGS. 4,5,6, the voltage across the sheath was not measured and thus the actual value of floating potential $V_f$ was not available. However, inspection of FIG. 4 shows that zero current flows at points 0,3a and 5. Since the floating potential is defined to be the voltage across the plasma sheath at which there is no current flow, points 0,3a and 5 of FIG. 4 therefore represents conditions at which the probe sheath voltage has achieved the floating potential. Note carefully also that these same points are also shown in FIG. 6 as points 0, 3 and 5.

This fact underscores the point that the sheath floating potential can occur at more that one non-zero probe bias voltages ($V_b$). During the quiescent interval, the probe sheath achieves floating potential at point 0 in FIG. 6 corresponding to a probe bias voltage of about 1 volt. During the interval when the RF is applied for the example given, the sheath achieves floating potential at point 3 in FIG. 6 corresponding to a probe bias voltage of −67.5 volts.

The shift in the probe bias voltage required to achieve the sheath floating potential during the application of the burst RF may be understood as follows. The application of the RF burst results in an RF voltage $V_{sheathRF}$ appearing across the sheath. However, as evidenced by FIG. 3, the probe is a non-linear device. It can be shown that this nonlinearity results in a DC shift in the sheath potential in accord with the relationship given below:

$$\Delta V_{sheathPotential} = \frac{2T_e}{3} \ln\left\{I_o\left[\frac{3V_{sheathRF}}{2T_e}\right]\right\} \quad \text{Equation 1}$$

Where $T_e$ is the electron temperature and $V_{sheathRF}$ is the amplitude of the voltage oscillation across the sheath. This voltage shift moves the sheath voltage away from the floating potential which then causes conduction current to flow through the sheath in accordance with the I-V relationship of FIG. 3. This flow of conduction current results in a charge accumulation on the plates of $C_{PIF}$. The capacitor will continue to acquire a charge until it reaches a potential of opposite sign to the RF induced shift in sheath potential given by the expression above. Eventually a new equilibrium conditions is established in which there is no net current flow indicating that the plasma sheath has been returned to the floating potential. In the specific instance of the example data of FIGS. 4,5,6, the system required the capacitor to charge to a value of −67.5 volts to return the sheath voltage to the floating potential.

Consequently the instant after RF is applied from RF burst source 202, there will be a probe RF voltage applied across both $C_{PIF}$ 206 and plasma 110. At the first instant of burst RF application, $C_{PIF}$ 206 is not charged and exhibits zero DC potential across its terminals. Furthermore, at the instant of burst RF application there is a shift in the probe sheath potential.

Figure 3:
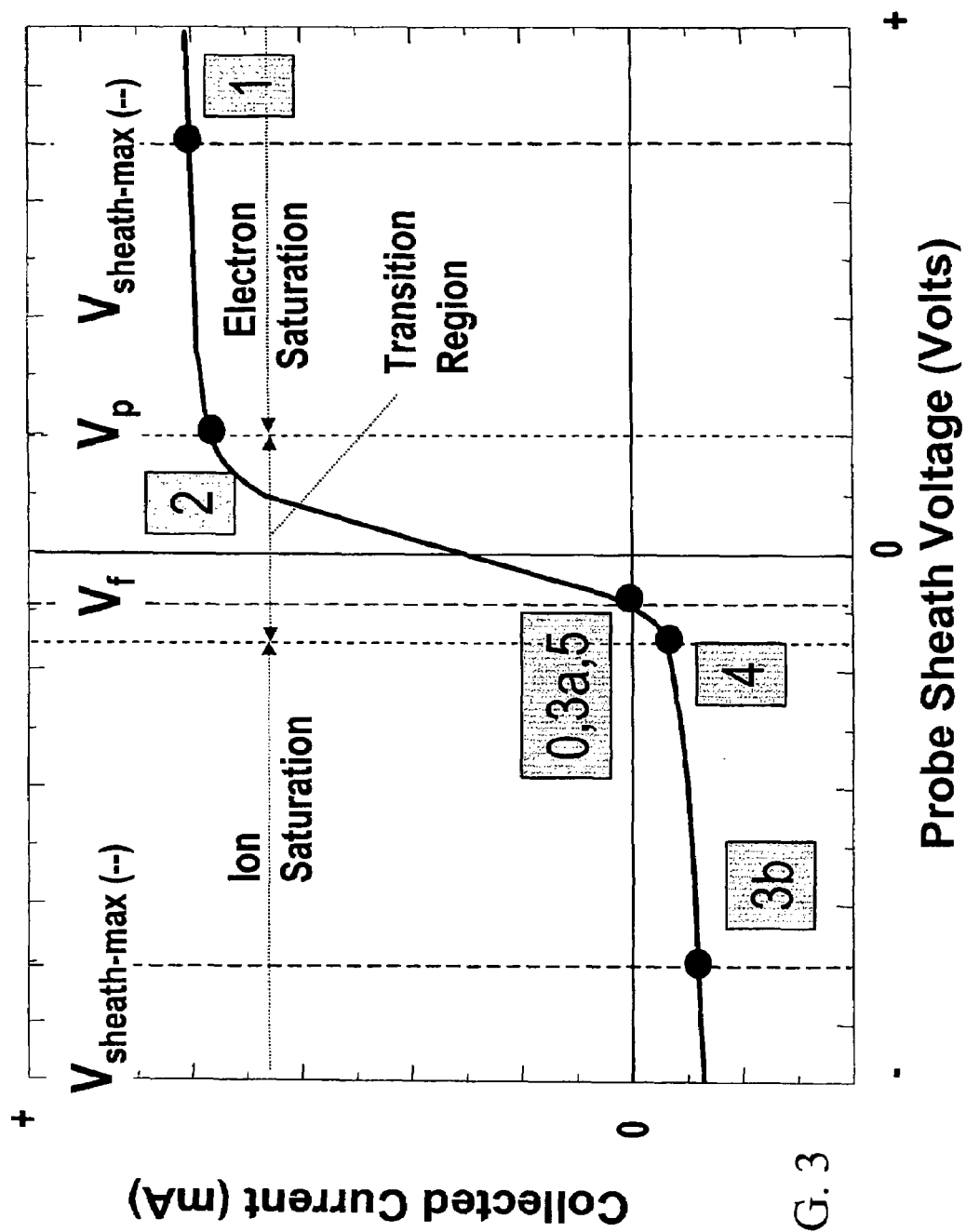
FIG. 3 illustrates a representative voltage-current relationship (I-V curve) experienced by the PIF system.

In most implementations, the probe RF voltage amplitude is sufficiently large to result in a probe sheath potential shift of sufficient magnitude to bias the sheath into the "electron saturation" region indicated in FIG. 3. Point 1 in FIGS. 3,4,5,6 denotes the instant at which the probe RF is first applied. Thus, upon onset of probe RF voltage application, conduction current will flow to $C_{PIF}$ 206. If the probe sheath potential shifted sufficient to achieve entry into the electron saturation, the magnitude of the charging current will be limited to the "electron saturation current".

The electron saturation current, or $I_e$, represents a limiting condition contingent on the basic parameters of the plasma such as electron density and temperature. The mechanism and means by which electron saturation current may be calculated are generally known to practitioners of the art. Further detailing of the mechanism which limits the current to the saturation value $I_e$ is not germane to understanding the invention.

During the application of probe RF, by convention, electrons are flowing from the plasma and toward the PIF probe. As current flows, $C_{PIF}$ starts become charged, with a positive charge accumulating on plate 214 and a negative charge accumulating on plate 216. This charge configuration on $C_{PIF}$ in turn causes the magnitude of the current flowing to charge $C_{PIF}$ to decrease. Eventually an equilibrium configuration is achieved. This can be understood as movement from point 1 to point 2 and then eventually to point 3a,5 in FIG. 3.

In accordance with the general description given above, the potential across $C_{PIF}$ decreases from point 1 in FIG. 6 until reaching point 3 in FIG. 6 sufficient to offset the probe sheath voltage shift induced by the applied RF. Note that to reach point 3 in FIG. 6, the system must pass through point 2 in FIG. 6, which represents a probe bias voltage which can be related to the plasma potential. This significance of this particular probe bias voltage will be discussed in greater detail below. Upon reaching the potential noted as point 3 in FIG. 6, the current drawn by $C_{PIF}$ becomes negligible and the probe bias voltage achieves a value $V_{b-max}$, which results in the probe sheath potential near its floating potential $V_f$ wherein the capacitor ceases to further acquire charge. Note that in this condition, the capacitor has charged to a potential necessary to counterbalance the shift in sheath potential induced by the applied RF. This equilibrium state is noted as point 3a, 5 in FIG. 6.

However, once RF burst source 202 is turned off, the RF induced shift in the sheath voltage is then removed. At this instant in time, the probe sheath voltage is determined by the potential of $C_{PIF}$ 206 given as point 3 in FIG. 6. This is also represented as a discontinuous jump from point 3a to 3b in FIG. 3. The probe sheath voltage is driven to a maximum negative value by the probe bias voltage and is then initially equal to $V_{sheath-max}$. The probe sheath voltage achieved is typically sufficient to bias the sheath into a condition known as the ion saturation regime as noted in FIG. 3.

The magnitude of the current flowing to ground 203 is commonly referred to as the ion saturation current, or $I_{i-sat}$, and is commonly at the maximum voltage ($V_{sheath\ max(-)}$) to which the sheath 213 is driven by the change in probe bias voltage which occurs when the RF is turned off. $I_{i-sat}$ represents a limiting condition contingent on the basic parameters of the plasma such as electron density and temperature. The mechanism and means by which electron saturation current may be calculated are generally known to practitioners of the art. Further detailing of the mechanism and calculation of this effect is not germane to understanding the invention.

As $C_{PIF}$ 206 begins to discharge, the probe bias voltage $V_b$ also begins to decay resulting in a decreasing current drawn from the plasma. Eventually this conduction current relaxes to zero. When the conduction current achieves zero value, the probe sheath potential will have achieved the floating potential $V_f$, wherein there is no further current flow. The functional relationship between the decay current and the probe bias voltage can be analyzed to obtain various parameters characterizing the plasma. For example, the linear portion of the current decay from point 3b to point 4 can be analyzed to obtain a measure of the ion flux incident upon the current collection surface.

Additionally, the non-linear current decay from point 4 to point 5 may be analyzed to obtain an estimate of plasma electron temperature. The method by which such analyses are implemented is a well documented aspect of Langmuir probe prior art and is well known to practitioners of this art.

Recall that during the RF burst interval, the PIF system will charge until point 3 in FIGS. 3,4,5,6 is reached. The inventor has observed that to reach point 3 in FIGS. 3,4,5,6, the system must pass through point 2 in FIGS. 3,4,5,6. As seen in FIG. 3, point 2 represents a sheath voltage ($V_p$) at which there is the onset of enhanced curvature (a "knee") in the plot of FIG. 3.

At this unique point, there occurs the circumstance in which the sheath potential becomes equivalent to the plasma potential. As the system passes through point 2 of FIG. 3, the "knee" also causes a disturbance in the curvature (slope) of the current as a function of probe voltage. This disturbance is plotted as point 2 in FIG. 4. The exact value of the probe voltage at which this occurs and the details of the shape of this disturbance are a result of a very complicated averaging effect of the interaction of the full time dependent behavior of the sheath voltage and the plasma potential. The details of this averaging effect are not germane to the invention.

In accordance with an aspect of the present invention, this disturbance, plotted as point 2 FIG. 4, may be further amplified by taking the derivative of the current signal with respect to time. This amplification results in a signal with a high signal-to-noise ratio, enabling applications such as automatic process control, end-pointing, system fault detection, etc.

An example is given in FIG. 5 which plots the time derivative of FIG. 4. FIG. 5 exhibits an easily distinguishable peak, labeled as point 2, which corresponds to the disturbance in the curvature noted as point 2 in FIG. 4. Note that this point 2 occurs during the burst phase of the RF, i.e., the charging phase of the PIF system, and generally occurs between the time the RF is turned on (point 1) and the time during which the plasma sheath potential equals the floating potential (point 3). The probe bias voltage at which this occurs is found by consulting FIG. 6 at which it is seen that the voltage of point 2 of FIG. 4 corresponds to the same instant in time as point 2 of FIGS. 5, 6.

Thus it is believed by the inventor that a method is achieved by which a relative measure of plasma potential may be made. The method, in summary, is that of the following:

Find the point at which there is a break in the curvature of the probe current during the burst RF phase. This is best done by differentiating the probe current with respect to time and searching for the resulting peak in the derivative of the current occurring during the application of burst RF.

Note the time at which the break in current curvature (as prescribed above) occurs (the break corresponds to, for example, the peak found in the current derivative plot).

Inspect the probe voltage as a function of time to determine the probe voltage as determined by step 2. We now define this voltage to be $V_{plasma\ potential-probe}$ The inventor believes that the probe bias voltage found by the procedure above is a relative measure of plasma potential. If the details of the sheath voltage can also be ascertained for this value of probe bias voltage the method can then be made absolute. Recall that after application of RF bias the system will acquire a probe bias voltage $V_{b-max}$ (point 3 in FIG. 6) at which value the sheath is found to be at the floating potential.

While not wishing to be bound by theory, the inventor also believes that the difference between $V_{plasma\ potential-probe}$ and $V_{b-max}$ also represents a measure of the difference between the sheath floating potential and the plasma potential. This observation advantageously has diagnostic value since the well established Langmuir probe theory asserts the following relationship for the difference between the sheath floating voltage and plasma potential when both are measured with respect to the same reference. This relationship is shown in Equation 2 (Braithwaite, et al. J. Phys. D: Appl. Phys. 36 (2003) 2837-2844) below:

$$V_p - V_{f1} = \frac{kT}{e}\left[\ln\left\{\sqrt{\frac{M}{2\pi m}}\right\} + \ln\left\{I_o\left(\frac{eV_{RF}}{kT}\right)\right\}\right]$$

In Equation 2 above, M is the mass of the positive ion species or an appropriate effective mass in the instance of multiple ion species, T is electron temperature, and m is the electron mass. Since the PIF method can also be utilized to obtain a measurement of Te, it is seen that Mi can be inferred from difference between the sheath floating voltage and plasma potential. This difference is, in turn, determinable from the method of the invention discussed above.

There are many possible applications of embodiments of the invention herein, particularly for controlling a substrate processing process that employs plasma in a plasma processing chamber. The controlling may be performed as part of automatic process control, end-pointing, maintenance monitoring, system fault detection, etc. to monitor, to generate an alarm, or to affect a transition in the process. The transition may include, for example, initiating an endpoint handling procedure if an endpoint condition is detected. As another example, the transition may include initiating a fault handling procedure if a fault condition is detected. As another example, the transition may include starting a new sub-step of the plasma process. These transitions may be performed if, for example, a value detected using embodiments of the invention fall within a predefined window, is equal to, or falls below, or exceeds some predefined value.

For example, variations in the time difference between time $t_{point2}$ (e.g., point 2 in FIGS. 4 and 5) where the break in the burst RF phase probe current curvature occurs and time $t_{point3a}$ (e.g., point 3a FIGS. 4 and 5) where the probe sheath voltage achieves the floating potential during the burst RF phase may be employed as a proxy for changes in the plasma ion energy. As discussed, this break may be detected more reliably by techniques such as taking the time derivative, as seen in FIG. 5. This time difference may be compared against a predefined window or a predefined value to ascertain, for example, if the ion energy reflects an acceptable operating condition, if an endpoint of a process step has been reached, if a process fault condition has occurred, etc.

Analogously, variations in the magnitude of the probe voltage corresponding to the burst RF phase probe current break point (which probe voltage is obtained by correlating time $t_x$ that the aforementioned break occurs in the burst RF phase of the probe current curvature with a similar time $t_x$ in the probe voltage curvature) relative to some reference voltage may also be employed as a proxy for changes in the plasma ion energy. The magnitude of the probe voltage corresponding to the burst RF phase probe current break point may be compared against a predefined window or a predefined value to ascertain, for example, if the ion energy reflects an acceptable operating condition, if an endpoint of a process step has been reached, if a process fault condition has occurred, etc.

As another application of embodiments of the invention, the ascertained difference between $V_{plasma\ potential-probe}$ and $V_{b-max}$ over time may be employed to detect changes in the plasma chemistry. The detection of changes in the plasma chemistry may then be employed for applications such as end-pointing (such as determining when a given layer is etched through), automatic process control, maintenance monitoring, and/or system fault detection, As discussed earlier, the difference between $V_{plasma\ potential-probe}$ and $V_{b-max}$ represents a measure of the difference between the sheath floating potential and the plasma potential. In turn, the difference between the sheath floating potential and the plasma potential relates to the effective ion mass M by Equation 2. In other words, a change in the effective ion mass M affects the value of $V_{plasma\ potential-probe}$ and $V_{b-max}$. By monitoring the difference of $V_{plasma\ potential-probe}$ and $V_{b-max}$ over time, changes in the effective ion mass can be ascertained for use in the aforementioned applications.

In an embodiment, if the effective ion mass M is independently ascertained, changes in the electron temperature Te may be derived using Equation 2 and the difference between the sheath floating potential and the plasma potential (which, as mentioned, relates to the difference between $V_{plasma\ potential-probe}$ and $V_{b-max}$). As such, embodiments of the invention provide a technique for detecting changes in the electron temperature (Te), which is an important parameter to monitor in many processes.

Other applications are also possible. For example, one or more of the parameters discussed above (e.g., ion energy, effective ion mass, electron temperature, etc.) derived from the relative plasma potential (which plasma potential relates to the probe voltage as discussed) may be employed to monitor the chamber condition as part of an ongoing maintenance program. Alternatively or additionally, the burst RF phase probe current and/or the burst RF phase probe voltage may employed to monitor the chamber condition as part of an ongoing maintenance program. Such monitoring may provide information to the operator of the plasma processing system of the current state of the plasma chamber and/or parts as well as possible upcoming maintenance tasks that may need to be performed.

While this invention has been described in terms of several preferred embodiments, there are alterations, permutations, and equivalents which fall within the scope of this invention. For example, while FIG. 2 discloses an arrangement that may be employed for ascertaining the relative plasma potential in accordance with embodiments of the invention, other arrangements are also possible. For example, it is possible to employ a variable voltage source to bias surface 103. This variable voltage source may supply a variety of time-dependent waveforms (e.g., square, triangular, sinusoidal, etc.) that could be used to effect a transition from point 1 to point 0, 3a, and 5 of FIG. 3. Analogously, suitable arrangements of passive and/or active components may also be used to apply a bias voltage to surface 103. As another example, although the etch application is employed for illustrating the invention, other applications (e.g., different types of plasma deposition) may also benefit from the invention. It should therefore be noted that there are many alternative ways of implementing the methods of the present invention.

Having disclosed example embodiments and the best mode, modifications and variations may be made to the disclosed embodiments while remaining within the subject and spirit of the invention as defined by the following claims.

What is claimed is:

1. A method for controlling a substrate processing process, said substrate processing process being configured to process a substrate using plasma in a substrate processing chamber, comprising:

providing a PIF (planar ion flux) measurement arrangement, said PIF measurement arrangement including at least a PIF probe that has a surface exposed to a plasma sheath of said plasma while said substrate is processed by said plasma;

alternately creating a charging phase and a quiescent phase for said PIF arrangement using an energy source that is configured to provide energy to said plasma via said PIF probe;

ascertaining a time $t_{point2}$, said time $t_{point2}$ representing a time during said charging phase of said PIF measurement arrangement wherein a first potential difference across said plasma sheath equals to a plasma potential of said plasma;

ascertaining a time $t_{point3a}$, said time $t_{point3a}$ representing a time during said charging phase of said PIF measurement arrangement wherein a second potential difference across said plasma sheath equals a floating potential, said floating potential representing a value of a potential difference across said plasma sheath during said charging phase when no current flows through said PIF probe; and generating a control signal to create at least one of an alarm and a transition in said substrate processing process if a time difference between said time $t_{point2}$ and said time $t_{point3a}$ meets a predefined condition.

2. The method of claim 1 wherein said time $t_{point2}$ is determined by analyzing at least a time derivative of a current that flows through said PIF probe during said charging phase, said time $t_{point2}$ being ascertained by detecting a peak in said time derivative of said current that flows through said PIF probe, said peak occurs between a time when said charging phase begins and said time $t_{point3a}$.

3. The method of claim 1 wherein said energy source represents a burst RF source.

4. The method of claim 1 wherein said energy source represents a variable voltage source.

5. The method of claim 3 wherein said variable voltage source is configured to generate time-dependent waveforms.

6. The method of claim 1 wherein said predefined condition is met if said time difference is within a predefined window of value.

7. The method of claim 1 wherein said predefined condition is met if said time difference is equal to or exceeds a predefined value.

8. The method of claim 1 wherein said predefined condition is met if said time difference is equal to or is below a predefined value.

9. The method of claim 1 wherein said transition represents an endpoint handling procedure.

10. The method of claim 1 wherein said transition represents a fault condition handling procedure.

11. The method of claim 1 wherein said transition represents starting a different substep of said substrate processing process.

12. A method for controlling a substrate processing process, said substrate processing process being configured to process a substrate using plasma in a substrate processing chamber, comprising:

providing a PIF (planar ion flux) measurement arrangement, said PIF measurement arrangement including at least a PIF probe that has a surface exposed to a plasma sheath of said plasma while said substrate is processed by said plasma;

alternately creating a charging phase and a quiescent phase for said PIF arrangement using an energy source that is configured to provide energy to said plasma via said PIF probe;

ascertaining a time $t_{point2}$, said time $t_{point2}$ representing a time during said charging phase of said PIF measurement arrangement wherein a first potential difference across said plasma sheath equals to a plasma potential of said plasma;

ascertaining a probe bias voltage at said time $t_{point2}$, said probe bias voltage at said time $t_{point2}$ representing a potential difference between said surface of said PIF probe and ground at said at said time $t_{point2}$; and generating a control signal to create at least one of an alarm and a transition in said substrate processing process if said probe bias voltage at said time $t_{point2}$ meets a predefined condition.

13. The method of claim 12 wherein said time $t_{point2}$ is determined by analyzing at least a time derivative of a current that flows through said PIF probe during said charging phase, said time $t_{point2}$ being ascertained by detecting a peak in said time derivative of said current that flows through said PIF probe, said peak occurs between a time when said charging phase begins and a time $t_{point3a}$, said time $t_{point3a}$ representing a time during said charging phase of said PIF measurement arrangement wherein a second potential difference across said plasma sheath equals a floating potential, said floating potential representing a value of a potential difference across said plasma sheath during said charging phase when no current flows through said PIF probe.

14. The method of claim 12 wherein said energy source represents a burst RF source.

15. The method of claim 12 wherein said energy source represents a variable voltage source.

16. The method of claim 14 wherein said variable voltage source is configured to generate time-dependent waveforms.

17. The method of claim 12 wherein said predefined condition is met if said probe bias voltage at said time $t_{point2}$ is within a predefined window of value.

18. The method of claim 12 wherein said predefined condition is met if said probe bias voltage at said time $t_{point2}$ is equal to or exceeds a predefined value.

19. The method of claim 12 wherein said predefined condition is met if said probe bias voltage at said time $t_{point2}$ is equal to or is below a predefined value.

20. The method of claim 12 wherein said transition represents an endpoint handling procedure.

21. The method of claim 12 wherein said transition represents a fault condition handling procedure.

22. The method of claim 12 wherein said transition represents starting a different substep of said substrate processing process.

23. A method for controlling a substrate processing process, said substrate processing process being configured to process a substrate using plasma in a substrate processing chamber, comprising:

providing a PIF (planar ion flux) measurement arrangement, said PIF measurement arrangement including at least a PIF probe that has a surface exposed to a plasma sheath of said plasma while said substrate is processed by said plasma;

alternately creating a charging phase and a quiescent phase for said PIF arrangement using an energy source that is configured to provide energy to said plasma via said PIF probe;

ascertaining a time $t_{point2}$, said time $t_{point2}$ representing a time during said charging phase of said PIF measurement arrangement wherein a first potential difference across said plasma sheath equals to a plasma potential of said plasma;

ascertaining a probe bias voltage at said time $t_{point2}$, said probe bias voltage at said time $t_{point2}$ representing a second potential difference between said surface of said PIF probe and ground at said at said time $t_{point2}$;

ascertaining a time $t_{point3a}$, said time $t_{point3a}$ representing a time during said charging phase of said PIF measurement arrangement wherein a second potential difference across said plasma sheath equals a floating potential, said floating potential representing a value of a third potential difference across said plasma sheath during said charging phase when no current flows through said PIF probe; and ascertaining a probe bias voltage at said time $t_{point3}$, said probe bias voltage at said time $t_{point3}$ representing a fourth potential difference between said surface of said PIF probe and said ground at said at said time $t_{point3}$;

ascertaining a difference between said probe bias voltage at said time $t_{point2}$ and said probe bias voltage at said time $t_{point3}$;

generating a control signal to create at least one of an alarm and a transition in said substrate processing process if said difference between said difference between said probe bias voltage at said time $t_{point2}$ and said probe bias voltage at said time $t_{point3}$ meets a predefined condition.

24. The method of claim 23 wherein said time $t_{point2}$ is determined by analyzing at least a time derivative of a current that flows through said PIF probe during said charging phase, said time $t_{point2}$ being ascertained by detecting a peak in said time derivative of said current that flows through said PIF probe, said peak occurs between a time when said charging phase begins and a time $t_{point3a}$, said time $t_{point3a}$ representing a time during said charging phase of said PIF measurement arrangement wherein a second potential difference across said plasma sheath equals a floating potential, said floating potential representing a value of a potential difference across said plasma sheath during said charging phase when no current flows through said PIF probe.

25. The method of claim 23 wherein said energy source represents a burst RF source.

26. The method of claim 23 wherein said energy source represents a variable voltage source.

27. The method of claim 25 wherein said variable voltage source is configured to generate time-dependent waveforms.

28. The method of claim 23 wherein said predefined condition is met if said difference between said probe bias voltage at said time $t_{point2}$ and said probe bias voltage at said time $t_{point3}$ is within a predefined window of value.

29. The method of claim 23 wherein said predefined condition is met if said difference between said difference between said probe bias voltage at said time $t_{point2}$ and said probe bias voltage at said time $t_{point3}$ is equal to or exceeds a predefined value.

30. The method of claim 23 wherein said predefined condition is met if said difference between said difference between said probe bias voltage at said time $t_{point2}$ and said probe bias voltage at said time $t_{point3}$ is equal to or is below a predefined value.

31. The method of claim 23 wherein said transition represents an endpoint handling procedure.

32. The method of claim 23 wherein said transition represents a fault condition handling procedure.

33. The method of claim 23 wherein said transition represents starting a different substep of said substrate processing process.

34. A method for controlling a substrate processing process, said substrate processing process being configured to process a substrate using plasma in a substrate processing chamber, comprising:

providing a PIF (planar ion flux) measurement arrangement, said PIF measurement arrangement including at least a PIF probe that has a surface exposed to a plasma sheath of said plasma while said substrate is processed by said plasma;

alternately creating a charging phase and a quiescent phase for said PIF arrangement using an energy source that is configured to provide energy to said plasma via said PIF probe;

ascertaining a time $t_{point2}$, said time $t_{point2}$ representing a time during said charging phase of said PIF measurement arrangement wherein a first potential difference across said plasma sheath equals to a plasma potential of said plasma;

ascertaining a probe bias voltage at said time $t_{point2}$, said probe bias voltage at said time $t_{point2}$ representing a second potential difference between said surface of said PIF probe and ground at said at said time $t_{point2}$;

ascertaining a time $t_{point3a}$, said time $t_{point3a}$ representing a time during said charging phase of said PIF measurement arrangement wherein a second potential difference across said plasma sheath equals a floating potential, said floating potential representing a value of a third potential difference across said plasma sheath during said charging phase when no current flows through said PIF probe; and ascertaining a probe bias voltage at said time $t_{point3}$, said probe bias voltage at said time $t_{point3}$ representing a fourth potential difference between said surface of said PIF probe and said ground at said at said time $t_{point3}$;

ascertaining a difference between said probe bias voltage at said time $t_{point2}$ and said probe bias voltage at said time $t_{point3}$;

ascertaining an electron temperature of said plasma using said difference between said probe bias voltage at said time $t_{point2}$ and said probe bias voltage at said time $t_{point3}$ and a effective ion mass value; and generating a control signal to create at least one of an alarm and a transition in said substrate processing process if said electron temperature meets a predefined condition.

35. The method of claim 34 wherein said time $t_{point2}$ is determined by analyzing at least a time derivative of a current that flows through said PIF probe during said charging phase, said time $t_{point2}$ being ascertained by detecting a peak in said time derivative of said current that flows through said PIF probe, said peak occurs between a time when said charging phase begins and a time $t_{point3a}$, said time $t_{point3a}$ representing a time during said charging phase of said PIF measurement arrangement wherein a second potential difference across said plasma sheath equals a floating potential, said floating potential representing a value of a potential difference across said plasma sheath during said charging phase when no current flows through said PIF probe.

36. The method of claim 34 wherein said energy source represents a burst RF source.

37. The method of claim 34 wherein said energy source represents a variable voltage source.

38. The method of claim 36 wherein said variable voltage source is configured to generate time-dependent waveforms.

39. The method of claim 34 wherein said predefined condition is met if said electron temperature is within a predefined window of value.

40. The method of claim 34 wherein said predefined condition is met if said electron temperature is equal to or exceeds a predefined value.

41. The method of claim 34 wherein said predefined condition is met if said electron temperature is equal to or is below a predefined value.

42. The method of claim 34 wherein said transition represents an endpoint handling procedure.

43. The method of claim 34 wherein said transition represents a fault condition handling procedure.

44. The method of claim 34 wherein said transition represents starting a different substep of said substrate processing process.

* * * * *